(12) United States Patent
Ho

(10) Patent No.: US 11,217,551 B1
(45) Date of Patent: Jan. 4, 2022

(54) CHIP PACKAGE STRUCTURE AND MANUFACTURING METHOD THEREOF

(71) Applicant: Chung W. Ho, Taipei (TW)

(72) Inventor: Chung W. Ho, Taipei (TW)

(*) Notice: Subject to any disclaimer, the term of this patent is extended or adjusted under 35 U.S.C. 154(b) by 0 days.

(21) Appl. No.: 17/209,230

(22) Filed: Mar. 23, 2021

(51) Int. Cl.
| | |
|---|---|
| *H01L 23/552* | (2006.01) |
| *H01L 23/00* | (2006.01) |
| *H01L 23/14* | (2006.01) |
| *H01L 23/538* | (2006.01) |
| *H01L 21/48* | (2006.01) |
| *H01L 21/683* | (2006.01) |

(52) U.S. Cl.
CPC .......... *H01L 24/20* (2013.01); *H01L 21/4853* (2013.01); *H01L 21/6835* (2013.01); *H01L 23/145* (2013.01); *H01L 23/5386* (2013.01); *H01L 23/552* (2013.01); *H01L 24/19* (2013.01); *H01L 2221/68313* (2013.01); *H01L 2221/68372* (2013.01); *H01L 2224/214* (2013.01); *H01L 2924/3025* (2013.01)

(58) Field of Classification Search
CPC ..... H01L 24/20; H01L 23/145; H01L 23/552; H01L 21/6835; H01L 21/4853; H01L 23/5386; H01L 24/19; H01L 2221/68313; H01L 2924/3025; H01L 2221/68372; H01L 2224/214
USPC ........................................................ 257/659
See application file for complete search history.

(56) References Cited

U.S. PATENT DOCUMENTS

| | | | | |
|---|---|---|---|---|
| 8,058,723 | B2 * | 11/2011 | Chia | ................. H01L 23/5389 257/700 |
| 9,564,411 | B2 * | 2/2017 | Park | ................. H01L 23/5383 |
| 9,751,293 | B2 | 9/2017 | Huang et al. | |
| 10,201,099 | B1 | 2/2019 | Ho | |
| 2020/0328182 | A1 * | 10/2020 | Waidhas | ............ H01L 23/5381 |

FOREIGN PATENT DOCUMENTS

| | | |
|---|---|---|
| CN | 105873843 | 8/2016 |
| CN | 109748090 | 5/2019 |
| CN | 111276407 | 6/2020 |
| TW | I268209 | 12/2006 |

(Continued)

OTHER PUBLICATIONS

"Office Action of Taiwan Counterpart Application", dated Aug. 31, 2021, p. 1-p. 4.

*Primary Examiner* — Vu A Vu
(74) *Attorney, Agent, or Firm* — JCIPRNET

(57) ABSTRACT

A manufacturing method of a chip package structure is provided. A carrier board with an accommodating cavity, a substrate, and a stainless steel layer sputtered on the substrate is disposed. A chip is disposed in the accommodating cavity of the carrier board. The chip has an active surface, a back surface opposite to the active surface, and multiple electrodes disposed on the active surface. A circuit structure layer is formed on the carrier board. The circuit structure layer includes a patterned circuit and multiple conductive vias. The patterned circuit is electrically connected to the electrodes of the chip through the conductive vias. An encapsulant is formed to cover the active surface of the chip and the circuit structure layer. The active surface of the chip and a bottom surface of the encapsulant are coplanar. The carrier board is removed to expose the chip disposed in the accommodating cavity.

13 Claims, 10 Drawing Sheets

(56) References Cited

FOREIGN PATENT DOCUMENTS

| TW | 201618240 | 5/2016 |
|----|-----------|--------|
| TW | 201926586 | 7/2019 |
| TW | 201929155 | 7/2019 |
| TW | 202021061 | 6/2020 |

* cited by examiner

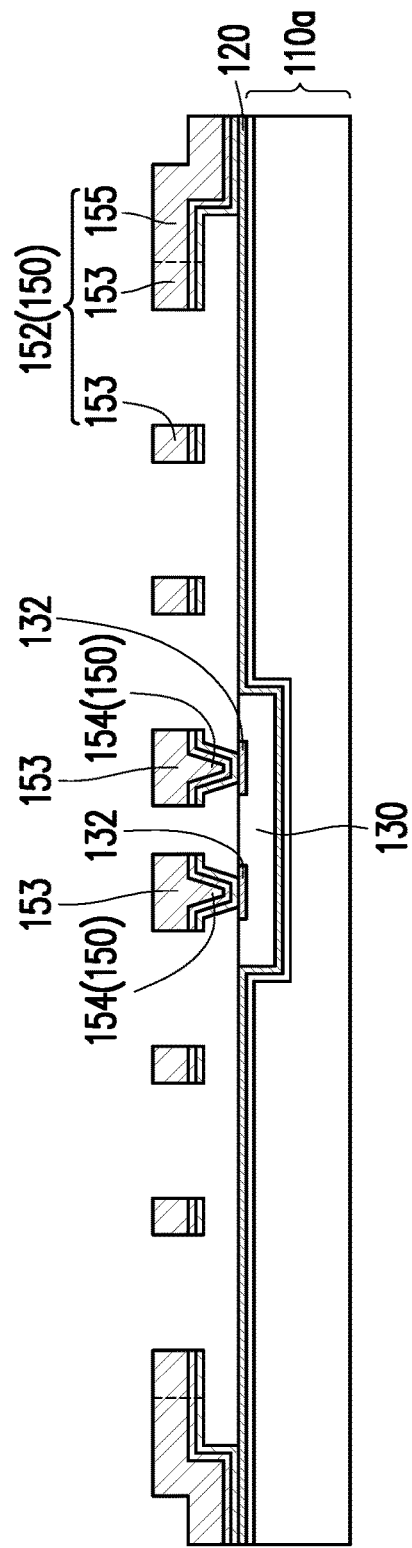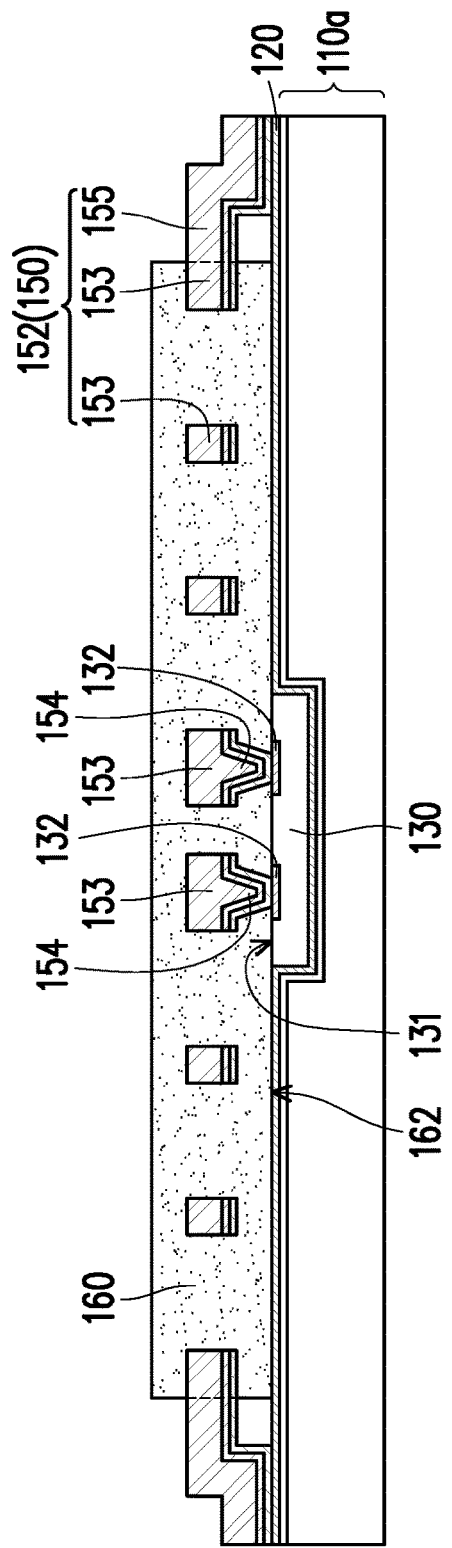

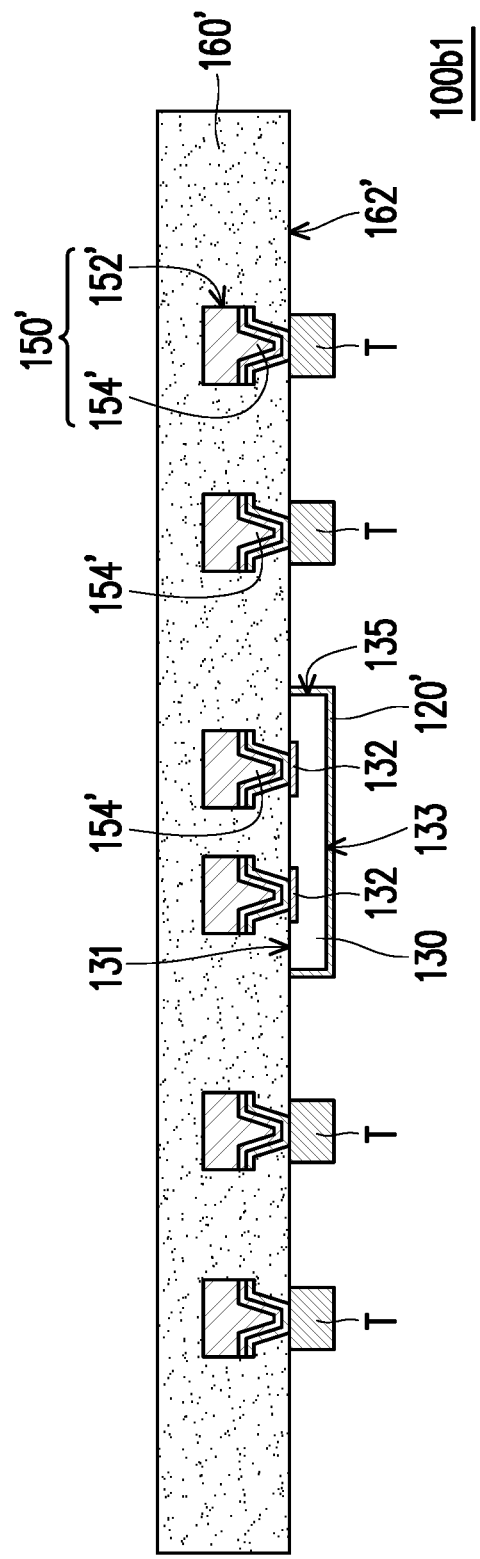
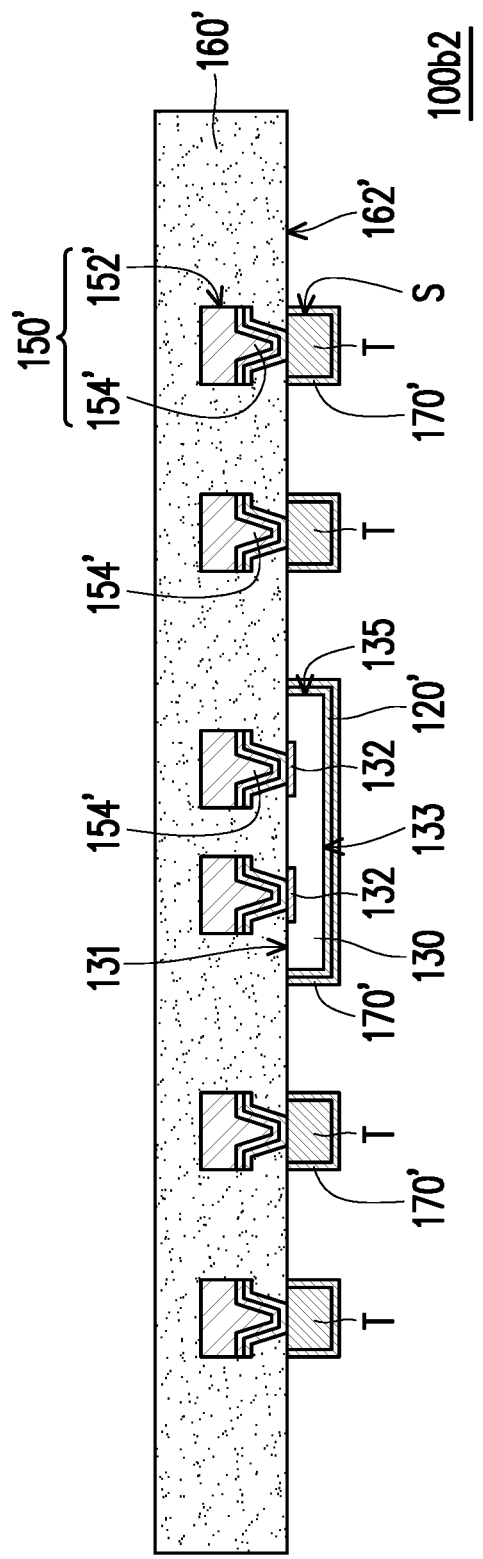

CHIP PACKAGE STRUCTURE AND MANUFACTURING METHOD THEREOF

BACKGROUND

Technical Field

The disclosure relates to a package structure and a manufacturing method thereof, and particularly, to a chip package structure and a manufacturing method thereof.

Description of Related Art

In the well-known coreless manufacturing process, the edge of part of the carrier board and the edge of part of the circuit board are first combined by adhesive or copper-plated edge sealing. In another conventional method, the carrier board includes a thin substrate (e.g., with a thickness of 100 microns) which contains glass fiber cloth, each of the both sides is connected to a piece of copper foil, and peelable ultra-thin copper foil (e.g. with a thickness ranging from 3 microns to 5 microns) is attached to the thin substrate. After the circuit board has undergone multiple processes, the part with the adhesive or the copper-plated edges between the carrier board and the circuit board is cut off to obtain the circuit board for the packaging process. However, in the well-known coreless manufacturing process, part of the carrier board and part of the circuit board need to be cut off. Therefore, the size of the circuit board may be reduced, and the cut-off carrier board cannot be reused, resulting in increased manufacturing costs.

To solve the above problems, in a conventional solution, a stainless steel plate is adopted as the base of the carrier board. In processing the circuit structure, the stainless steel plate not only provides good stability but requires no cutting when the board is removed, so it can be reused, which in turn can effectively save the manufacturing costs. However, the stainless steel plate is heavy, so during the processing, handling and moving are often difficult. Moreover, the edges and corners of the stainless steel plate are relatively sharp, often causing damages to the equipment.

In addition, in the conventional manufacturing method of the chip package structure, an over molded step is applied to a die, with copper pillars on its electrodes, placed on top of a glass substrate; then a grinding process is used to expose the top of the pillars; the interconnections are formed on the molding surface after grinding. There are die shifts, temperature constraints, and substrate warpage issues, and the process is therefore complicated and costly.

SUMMARY

The disclosure provides a chip package structure and a manufacturing method thereof, which are simple and straightforward in processing and are capable of effectively reducing the manufacturing costs and improving the product yield.

A manufacturing method of a chip package structure in the disclosure includes the following steps. A carrier board is disposed. The carrier board has an accommodating cavity, a substrate, and a stainless steel layer sputtered on the substrate including the inside the cavity area. A chip is disposed in the accommodating cavity of the carrier board. The chip has an active surface, a back surface opposite to the active surface, and multiple electrodes disposed on the active surface. A circuit structure layer is formed on the carrier board. The circuit structure layer includes a patterned circuit and multiple conductive vias. The patterned circuit is electrically connected to the electrodes of the chip through the conductive vias. An encapsulant is formed to cover the active surface of the chip and the circuit structure layer. The active surface of the chip and a bottom surface of the encapsulant are coplanar. The carrier board is removed to expose the chip disposed in the accommodating cavity.

In an embodiment of the disclosure, a material of the substrate includes a sheet-shaped glass fiber resin substrate, a roll-shaped glass fiber resin substrate, or a roll-shaped stainless steel substrate.

In an embodiment of the disclosure, the manufacturing method of the chip package structure further includes steps of forming a metal layer on the stainless steel layer before disposing the chip in the accommodating cavity of the carrier board and removing the metal layer at its interface with the stainless steel layer when removing the carrier board.

In an embodiment of the disclosure, the step of forming the circuit structure layer on the carrier board includes forming a first patterned photoresist layer on the metal layer. The first patterned photoresist layer exposes the electrodes of the chip and part of the metal layer. A thin first metal layer and the second metal layer on the first metal layer are sputtered on the first patterned photoresist layer as the plating base, on the exposed electrode of the chip, and on the exposed metal layer. A second patterned photoresist layer is formed on the second metal layer, and the second patterned photoresist layer is disposed above the first patterned photoresist layer and exposes part of the second metal layer. An electroplating process is performed to form a conductive material layer on the second patterned photoresist layer and the exposed second metal layer. The first patterned photoresist layer, the second patterned photoresist layer, part of the first metal layer, and part of the second metal layer are removed to form a circuit structure layer; and the metal layer is exposed. The patterned circuit of the circuit structure layer includes multiple inner pins and multiple outer pins to connect to the outside world. The inner pins are separated from one another and disposed above the chip. The outer pins are connected to the inner pins and extendedly disposed on the metal layer.

In an embodiment of the disclosure, the encapsulant covers part of the metal layer and the active surface of the chip and encapsulates the inner pins and the conductive vias.

In an embodiment of the disclosure, the manufacturing method of the chip package structure further includes steps of exposing the metal layer on the back surface of the chip when removing the carrier board and forming a surface treatment layer on the metal layer on the back side of the chip.

In an embodiment of the disclosure, the carrier board further includes multiple indentations, the indentations surround the accommodating cavity, and the stainless steel layer and the substrate are conformally disposed.

In an embodiment of the disclosure, the manufacturing method of the chip package structure further includes the following steps. A metal layer is formed on the stainless steel layer before disposing the chip in the accommodating cavity of the carrier board. The metal layer fills the indentations to define multiple conductive bumps. When removing the carrier board, both the conductive bumps on the bottom surface of the encapsulant and part of the metal layer on the back surface of the chip are exposed.

In an embodiment of the disclosure, the step of forming the circuit structure layer on the carrier board includes forming a first patterned photoresist layer on the metal layer.

The first patterned photoresist layer exposes the electrodes of the chip and part of the metal layer. The first metal layer and the second metal layer on the first metal layer are sputtered on the first patterned photoresist layer, on the exposed electrode of the chip, and on the metal layer. A second patterned photoresist layer is formed on the second metal layer, and the second patterned photoresist layer is disposed above the first patterned photoresist layer and exposes part of the second metal layer. An electroplating process is performed to form a conductive material layer on the second patterned photoresist layer and the exposed second metal layer. The first patterned photoresist layer, the second patterned photoresist layer, part of the first metal layer, and part of the second metal layer are removed to form a circuit structure layer, and the metal layer is exposed.

In an embodiment of the disclosure, the encapsulant covers the metal layer and the active surface of the chip and encapsulates the patterned circuit and the conductive vias.

In an embodiment of the disclosure, the manufacturing method of the chip package structure further includes the step of forming a surface treatment layer on a peripheral surface of the conductive bumps and the metal layer on the back surface of the chip after removing the carrier board.

The chip package structure of the disclosure includes a circuit structure layer, a chip, and an encapsulant. The circuit structure layer includes a patterned circuit and multiple conductive vias. The chip includes an active surface, a back surface opposite to the active surface, and multiple electrodes disposed on the active surface. The patterned circuit is electrically connected to the electrodes of the chip through the conductive vias. The encapsulant covers the active surface of the chip and the circuit structure layer. The active surface of the chip and a bottom surface of the encapsulant are coplanar.

In an embodiment of the disclosure, the patterned circuit includes multiple inner pins and multiple outer pins. The inner pins are separated from one another and disposed above the chip. The encapsulant encapsulates the inner pins and the conductive vias, and the outer pins are connected to the inner pins and extend beyond the encapsulant.

In an embodiment of the disclosure, the chip package structure further includes a surface treatment layer disposed on the back surface of the chip and a metal layer on a side surface of the chip connected to the back surface.

In an embodiment of the disclosure, the chip package structure further includes multiple conductive bumps disposed on the bottom surface of the encapsulant and electronically connected to the patterned circuit through the conductive vias.

In an embodiment of the disclosure, the chip package structure further includes a surface treatment layer disposed on the back surface of the chip, on a side surface of the chip connected to the back surface, and on a peripheral surface of the conductive bumps.

Based on the above, in the manufacturing method of the chip package structure in the disclosure, the stainless steel layer is formed on the substrate of the carrier board by sputtering. Therefore, in processing the circuit structure layer, good stability can be provided. Furthermore, compared to conventional stainless steel plates, the stainless steel layer formed by sputtering has a smaller volume and weight and retains the feature that the stainless steel film and the copper-plated film thereon can be separated mechanically. Moreover, it is safer and simpler in operation. In addition, cutting is not required when separating the carrier board to expose the circuit structure layer, so the carrier board can be reused, thereby effectively saving the manufacturing costs.

In order to make the features and the advantages of the disclosure comprehensible, embodiments accompanied with drawings are described in detail below.

BRIEF DESCRIPTION OF THE DRAWINGS

The accompanying drawings are included for further comprehension of the disclosure, and the accompanying drawings are incorporated into the specification and constitute a part of the specification. The drawings illustrate the embodiments of the disclosure, and together with the description serve to explain the principles of the disclosure.

FIG. 1A to FIG. 1I are schematic cross-sectional views illustrating a manufacturing method of a chip package structure according to an embodiment of the disclosure.

FIG. 2A to FIG. 2I are schematic cross-sectional views illustrating a manufacturing method of a chip package structure according to another embodiment of the disclosure.

FIG. 2J is a schematic cross-sectional view illustrating a chip package structure according to another embodiment of the disclosure.

DESCRIPTION OF THE EMBODIMENTS

Figure 1A:
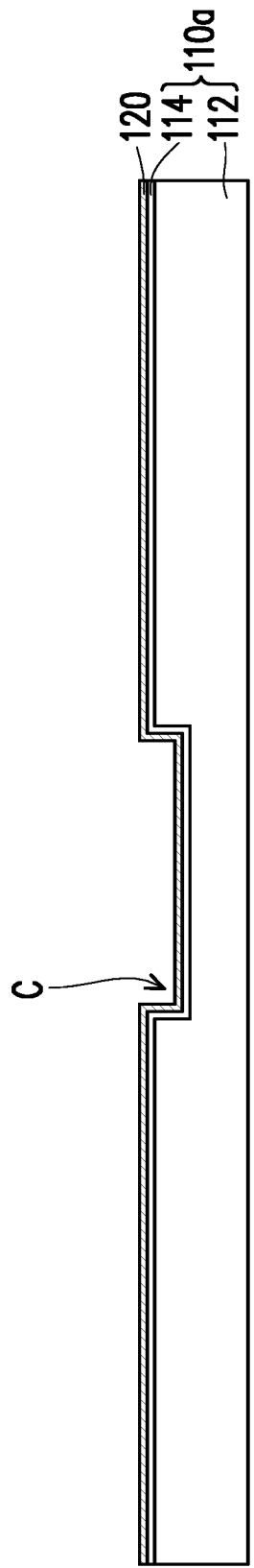

References of the exemplary embodiments of the disclosure are to be made in detail. Examples of the exemplary embodiments are illustrated in the drawings. If applicable, the same reference numerals in the drawings and the descriptions indicate the same or similar parts.

FIG. 1A to FIG. 1I are schematic cross-sectional views illustrating a manufacturing method of a chip package structure according to an embodiment of the disclosure. Regarding the manufacturing method of the chip package structure in the embodiment, first referring to FIG. 1A, a carrier board 110a is disposed; and the carrier board 110a has an accommodating cavity C and includes a substrate 112 and a stainless steel layer 114 sputtered on the substrate 112. Meanwhile, the substrate 112 may be a rigid substrate including a glass fiber resin substrate and copper foil disposed on opposite sides of the glass fiber resin substrate; alternatively a roll-shaped glass fiber resin substrate, or a roll-shaped stainless steel substrate; or a glass substrate that has been electroplated with a titanium layer and a copper layer, and all of which belong to the scope of the disclosure. The material of the stainless steel layer 114 may be SUS 304 stainless steel or other suitable models of stainless steel, for example. The thickness of the stainless steel layer 114 ranges from 0.05 μm to 0.5 μm, for example. In other words, the stainless steel layer 114 can be regarded as a stainless steel film.

Next, referring to FIG. 1A again, a metal layer 120 is formed on the stainless steel layer 114. Meanwhile, the metal layer 120 and the carrier board 110a are conformally disposed, and the material of the metal layer 120 is copper, for example, but the disclosure is not limited thereto.

Figure 1B:
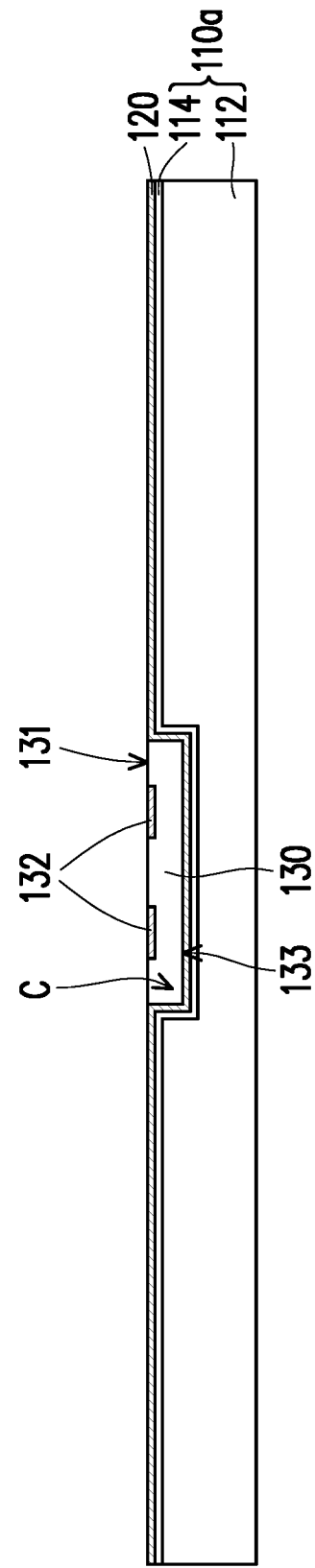

Next, referring to FIG. 1B, a chip 130 is disposed in the accommodating cavity C of the carrier board 110a. The chip 130 has an active surface 131, a back surface 133 opposite to the active surface 131, and multiple electrodes 132 disposed on the active surface 131. Meanwhile, the chip 130 is disposed on the metal layer 120 corresponding to the accommodating cavity C of the carrier board 110a, and the material of the electrode 132 is aluminum, for example, but the disclosure is not limited thereto.

Figure 1C:
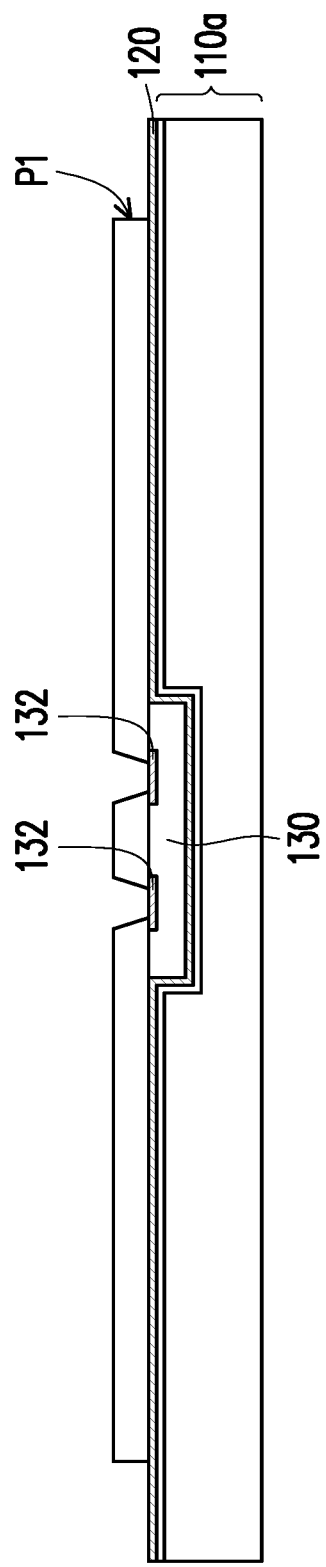

Next, referring to FIG. 1C, a first patterned photoresist layer P1 is formed on the metal layer 120, and the first patterned photoresist layer P1 exposes the electrodes 132 of the chip 130 and part of the metal layer 120.

Figure 1D:
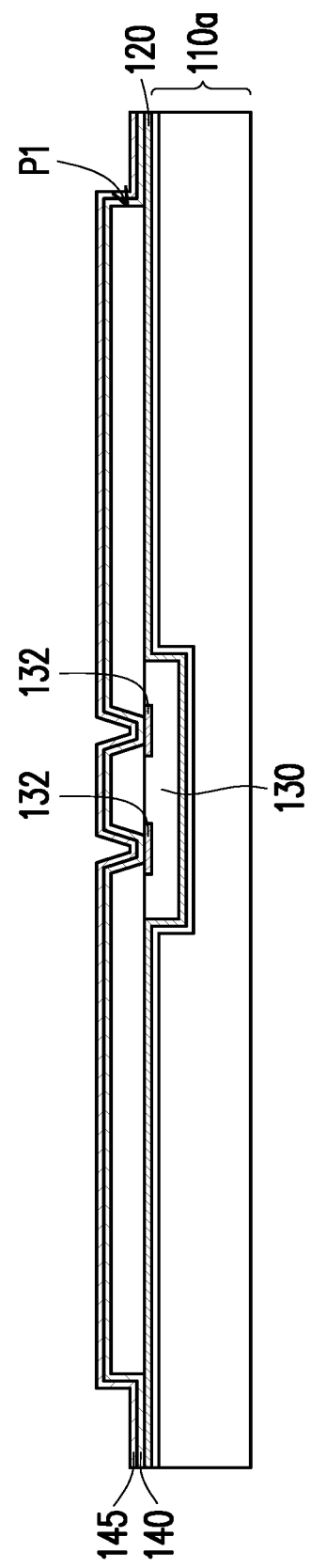

Next, referring to FIG. 1D, a first metal layer 140 and a second metal layer 145 on the first metal layer 140 are sputtered on the first patterned photoresist layer P1, on the exposed electrodes 132 of the chip 130, and on the exposed metal layer 120. Meanwhile, the first metal layer 140 is a titanium layer, for example; and the second metal layer 145 is a copper layer, for example. Alternatively, the first metal layer 140 is a chromium layer, for example; and the second metal layer 145 is a copper layer, for example.

Figure 1E:
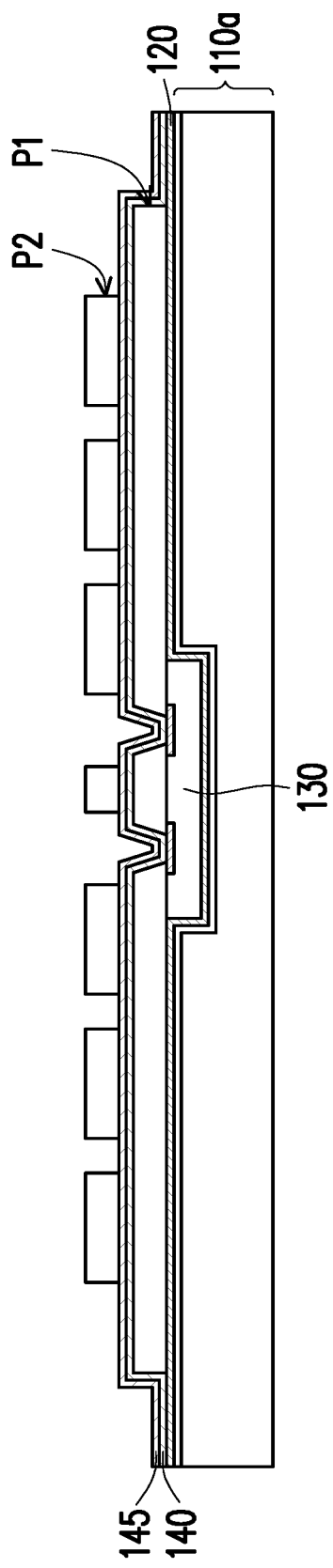

Next, referring to FIG. 1E, a second patterned photoresist layer P2 is formed on the second metal layer 145, the second patterned photoresist layer P2 is disposed above the first patterned photoresist layer P1, and part of the second metal layer 145 is exposed. Meanwhile, the pattern of the first patterned photoresist layer P1 is different from the pattern of the second patterned photoresist layer P2.

Figure 1F:
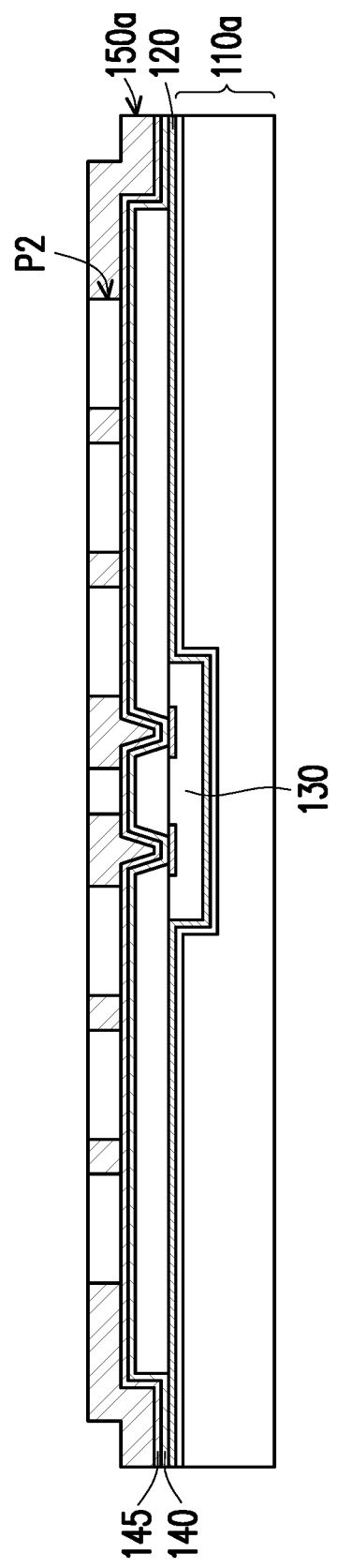

Next, referring to FIG. 1F, the second metal layer 145 is served as an electroplating seed layer to perform an electroplating process to form a conductive material layer 150a on the second patterned photoresist layer P2 and the exposed second metal layer 145.

Next, referring to both FIG. 1F and FIG. 1G, the first patterned photoresist layer P1, the second patterned photoresist layer P2, part of the first metal layer 140, and part of the second metal layer 145 are removed; a circuit structure layer 150 is formed; and the metal layer 120 is exposed. At this phase, the circuit structure layer 150 has been formed on the carrier board 110a, the circuit structure layer 150 includes a patterned circuit 152 and multiple conductive vias 154, and the patterned circuit 152 is electrically connected to the electrode 132 of the chip 130 through the conductive via 154. Meanwhile, the patterned circuit 152 of the circuit structure layer 150 includes multiple inner pins 153 and multiple outer pins 155, the inner pins 153 are separated from one another and disposed above the chip 130, and the outer pins 155 are connected to the inner pins 153 and are extendedly disposed on the metal layer 120. Moreover, the conductive via 154 is formed by the remaining first metal layer 140, the remaining second metal layer 145, and part of the conductive material layer 150a. According to the foregoing description, the dielectric layer is not adopted to process the circuit structure layer in the embodiment, but by removing the photoresist, part of the circuit is suspended to form an air bridge structure. At this phase, the circuit structure layer 150 may be regarded as a kind of lead frame.

Subsequently, referring to FIG. 1H, an encapsulant 160 is formed to cover the active surface 131 of the chip 130 and the circuit structure layer 150. The active surface 131 of the chip 130 and a bottom surface 162 of the encapsulant 160 are coplanar. Meanwhile, the encapsulant 160 covers part of the metal layer 120 and the active surface 131 of the chip 130 and encapsulates the inner pins 153 and the conductive vias 154.

Figure 1I:
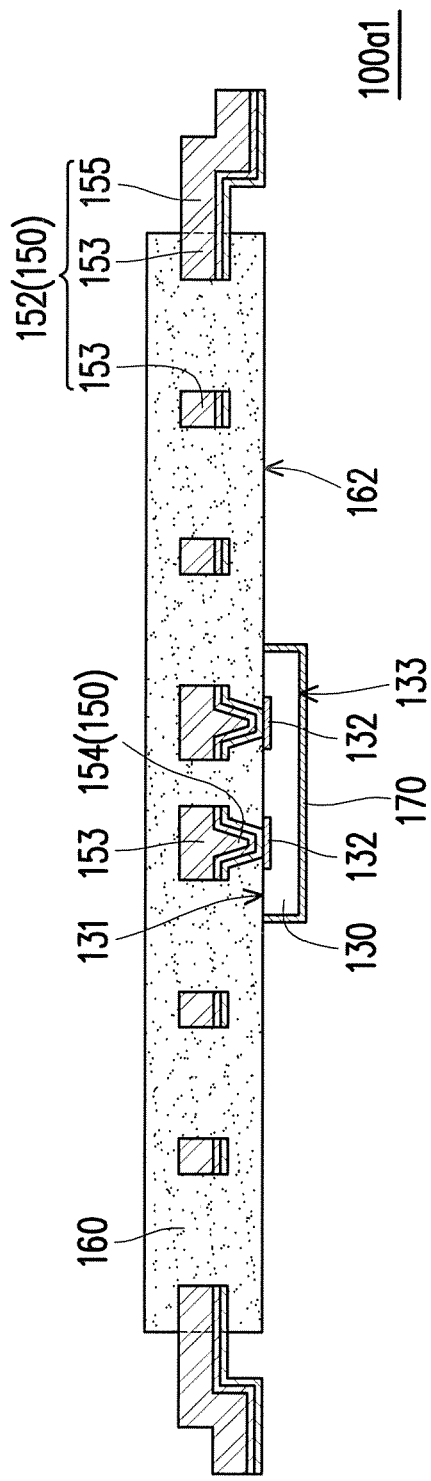

Finally, referring to both FIG. 1H and FIG. 1I, the carrier board 110a and part of the metal layer 120 are removed to expose the bottom surface 162 of the encapsulant 160. Meanwhile, the method for removing the carrier board 110a is that the encapsulant 160 is disposed on a vacuum platform (not shown) in a facing down manner, for example; and the encapsulant 160 is held firmly by a vacuum. Moreover, the encapsulant 160 is fixed by a mechanism and is separated from the metal layer 120 on the carrier board 110a along the interface of the stainless steel layer 114. Compared to the conventional method for removing the carrier board, the carrier board 110a in the embodiment requires no cutting, so the carrier board 110a can be reused, thereby effectively saving the manufacturing costs. Moreover, the method for removing the metal layer 120 is etching, for example. At this phase, the processing of a lead frame type of chip package structure 100a1 has been completed.

In terms of structure, referring to FIG. 1I again, the chip package structure 100a1 includes the circuit structure layer 150, the chip 130, and the encapsulant 160. The circuit structure layer 150 includes the patterned circuit 152 and the conductive vias 154. The chip 130 has the active surface 131, the back surface 133 opposite to the active surface 131, and the electrodes 132 disposed on the active surface 131. The patterned circuit 152 includes the inner pins 153 and the outer pins 155, the inner pins 153 are separated from one another and disposed above the chip 130, and the inner pins 153 of the patterned circuit 152 are electrically connected to the electrodes 132 of the chip 130 through the conductive vias 154. The encapsulant 160 covers the active surface 131 of the chip 130 and the circuit structure layer 150, the encapsulant 160 encapsulates the inner pins 153 and the conductive vias 154, and the outer pins 155 are connected to the inner pins 153 and extend beyond the encapsulant 160. Specifically, the active surface 131 of the chip 130 and the bottom surface 162 of the encapsulant 160 are coplanar.

In short, in the manufacturing method of the chip package structure 100a1 of the embodiment, the stainless steel layer 114 is formed on the substrate 112 of the carrier board 110a by sputtering. Therefore, in processing the circuit structure layer 150, good stability can be provided. Furthermore, the stainless steel layer 114 formed by sputtering can have a smaller volume and weight compared to those of the conventional stainless steel plate, and it is safer and simpler in operation. In addition, the carrier board 110a requires no cutting when being separated, so the carrier board 110a can be reused, thereby effectively saving the manufacturing cost.

Figure 1J:
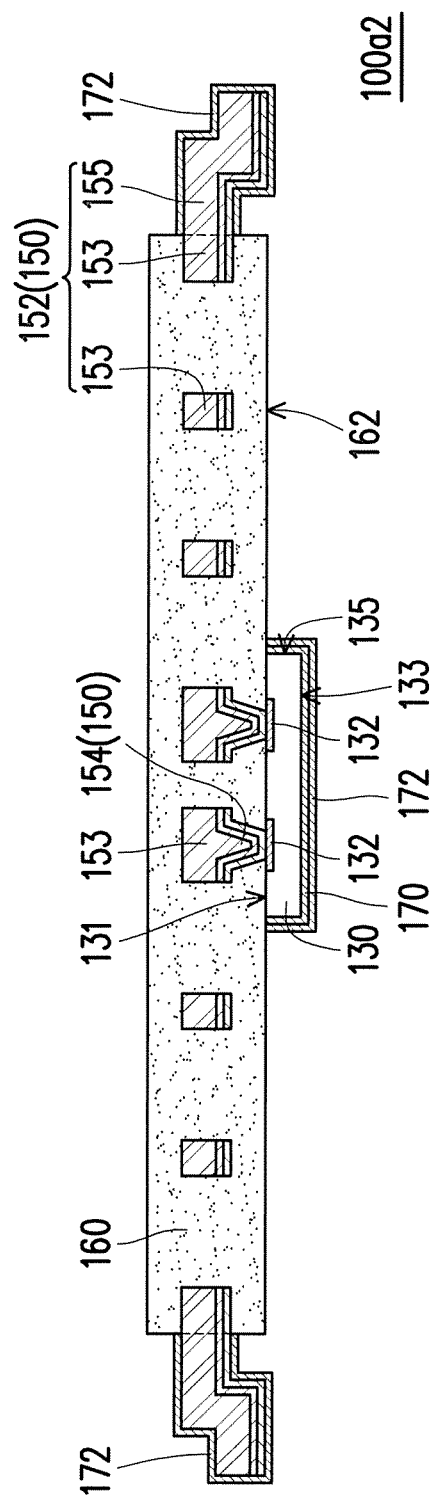
FIG. 1J is a schematic cross-sectional view illustrating a chip package structure according to an embodiment of the disclosure.

FIG. 1J is a schematic cross-sectional view illustrating a chip package structure according to an embodiment of the disclosure. In the embodiment, the reference numerals and a part of the contents of the above embodiments are used, the same reference numerals are used to denote the same or similar elements, and the description of the same technical contents is omitted. For the description of the omitted part, reference may be made to the above embodiments, and details are not iterated in the embodiment.

Referring to FIG. 1J, in FIG. 1H, only part of the metal layer 120 is removed after the carrier board 110a is removed, and the metal layers on a side surface 135 and the back surface 133 of the chip 130 are remained and become a metal layer 170. Then, a surface treatment layer 172 is formed on the metal layer 170 on the back surface 133 of the chip 130, and on the surface of the outer pin 155. Meanwhile, the material of the surface treatment layer 172 is tin, for example, but the disclosure is not limited thereto. At this phase, the processing of a lead frame type of chip package structure 100a2 has been completed. At this phase, the processing of a lead frame type of chip package structure 100a2 has been completed.

Since the chip package structure 100a2 in the embodiment has the metal layer 170 disposed on the back surface 133 of the chip 130, the metal layer 170 can be directly served as a shielding layer for preventing electromagnetic interference. Compared to conventional shielding plates or grounding plates which are additionally disposed as requirements, the chip package structure 100a2 in the embodiment can have a thinner package thickness and contribute to the reduction of the manufacturing costs.

FIG. 2A to FIG. 2I are schematic cross-sectional views illustrating a manufacturing method of a chip package structure according to another embodiment of the disclosure. Regarding the manufacturing method of the chip package in the embodiment, first referring to FIG. 2A, a carrier board 110b is disposed, and the carrier board 110b has an accommodating cavity C' and multiple indentations C1 surrounding the accommodating cavity C'. The carrier board 110b includes a substrate 112' and a stainless steel layer 114' sputtered on the substrate 112'. Meanwhile, the stainless steel layer 114' and the substrate 112' are conformally disposed. Meanwhile, the substrate 112' may be a rigid substrate including a glass fiber resin substrate and copper foil disposed on opposite sides of the glass fiber resin substrate; alternatively a roll-shaped glass fiber resin substrate, or a roll-shaped stainless steel substrate; or a glass substrate that has been electroplated with a titanium layer and a copper layer, and all of which belong to the scope of the disclosure. The material of the stainless steel layer 114' may be SUS 304 stainless steel or other suitable models of stainless steel, for example. The thickness of the stainless steel layer 114' ranges from 0.05 μm to 0.5 μm, for example. In other words, the stainless steel layer 114' may be regarded as a stainless steel film.

Figure 2A:
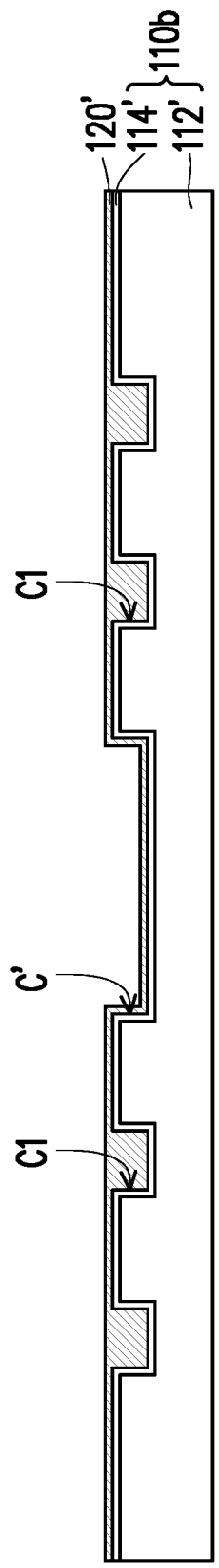
Figure 2B:
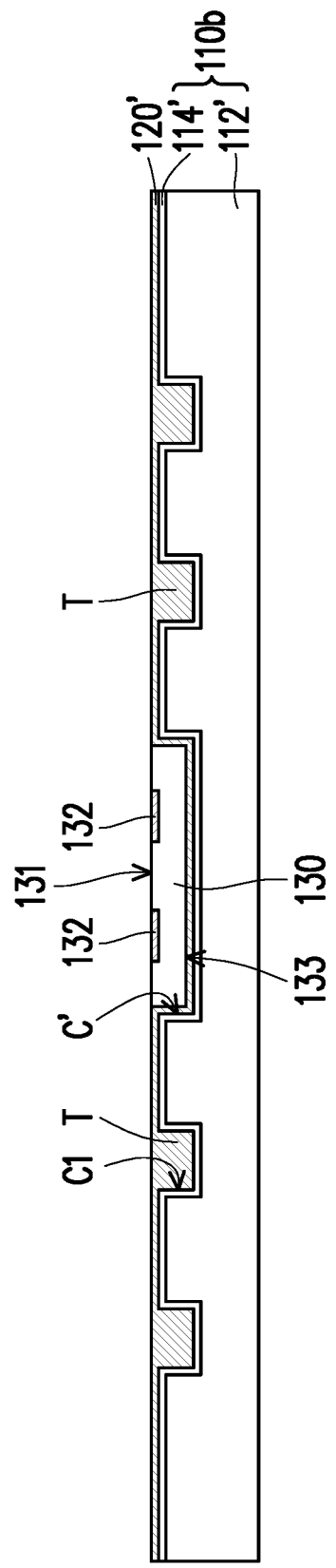

Next, referring to FIG. 2B, a metal layer 120' is formed on the stainless steel layer 114', and the metal layer 120' fills the indentations C1 to define multiple conductive bumps T. Meanwhile, the material of the metal layer 120' is copper, for example, but the disclosure is not limited thereto.

Next, referring to FIG. 2B again, the chip 130 is disposed in the accommodating cavity C' of the carrier board 110b. The chip 130 has the active surface 131, the back surface 133 opposite to the active surface 131, and the multiple electrodes 132 disposed on the active surface 131. Meanwhile, the chip 130 is disposed on the metal layer 120' corresponding to the accommodating cavity C' of the carrier board 110b, and the material of the electrode 132 is aluminum, for example, but the disclosure is not limited thereto.

Figure 2C:
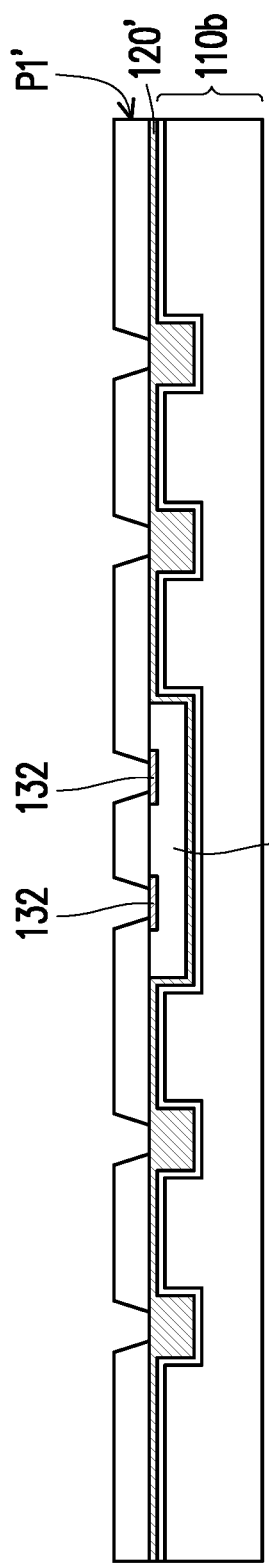

Next, referring to FIG. 2C, a first patterned photoresist layer P1' is formed on the metal layer 120, and the first patterned photoresist layer P1' exposes the electrodes 132 of the chip 130 and part of the metal layer 120'.

Figure 2D:
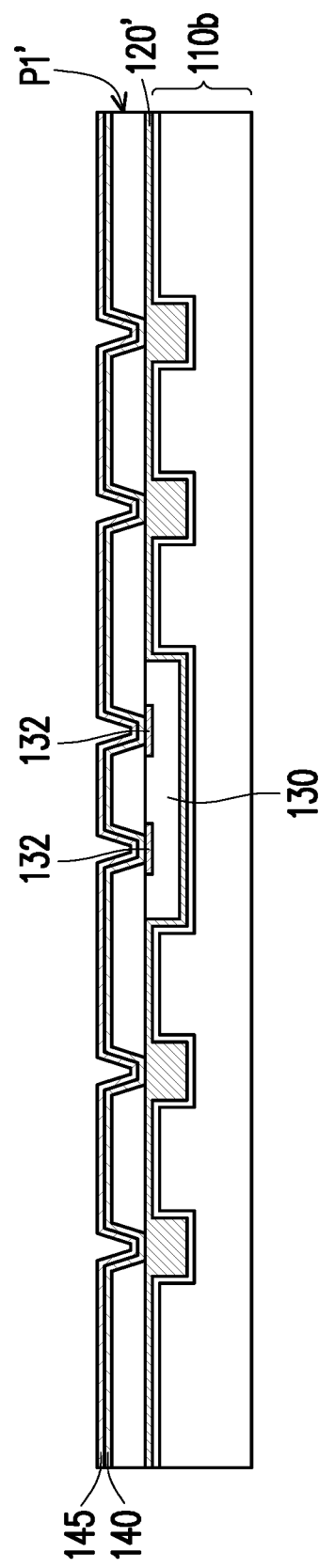

Next, referring to FIG. 2D, the first metal layer 140 and the second metal layer 145 on the first metal layer 140 are sputtered on the first patterned photoresist layer P1', on the exposed electrodes 132 of the chip 130, and on the exposed metal layer 120'. Meanwhile, the first metal layer 140 is a titanium layer, for example; and the second metal layer 145 is a copper layer, for example. Alternatively, the first metal layer 140 is a chromium layer, for example; and the second metal layer 145 is a copper layer, for example.

Figure 2E:
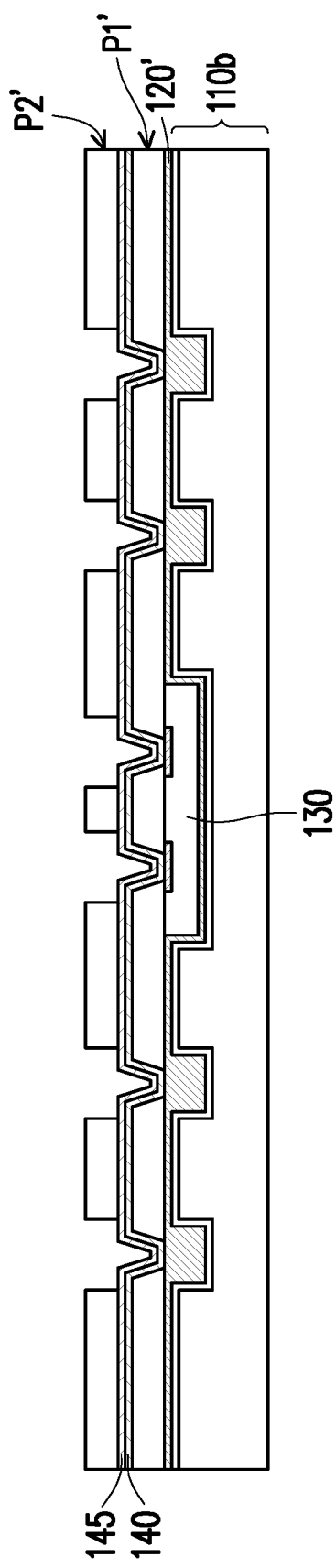

Next, referring to FIG. 2E, a second patterned photoresist layer P2' is formed on the second metal layer 145, the second patterned photoresist layer P2' is disposed above the first patterned photoresist layer P1', and part of the second metal layer 145 is exposed. Meanwhile, the pattern of the first patterned photoresist layer P1' is different from the pattern of the second patterned photoresist layer P2'.

Figure 2F:
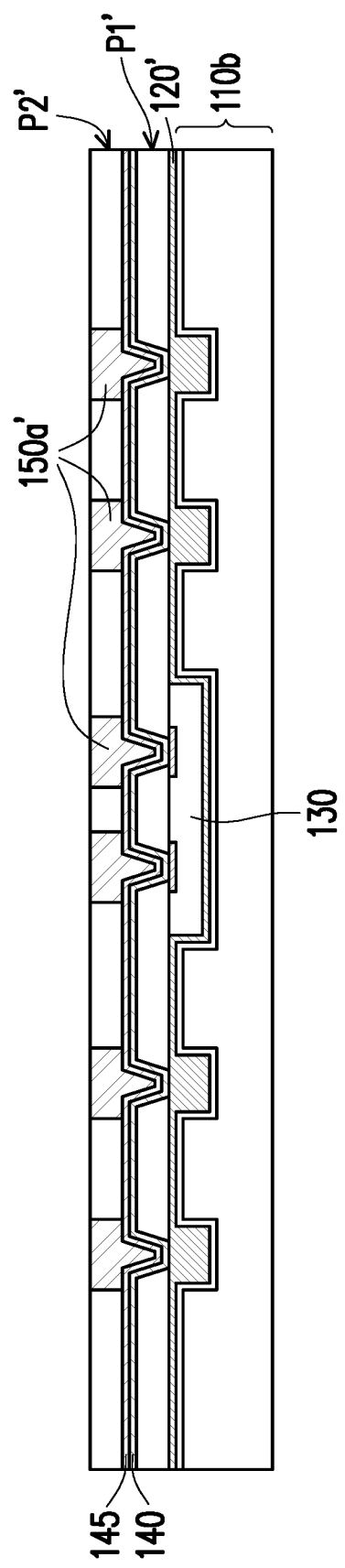

Next, referring to FIG. 2F, the second metal layer 145 is served as an electroplating seed layer to perform an electroplating process to form a conductive material layer 150a' on the second patterned photoresist layer P2' and the exposed second metal layer 145.

Figure 2G:
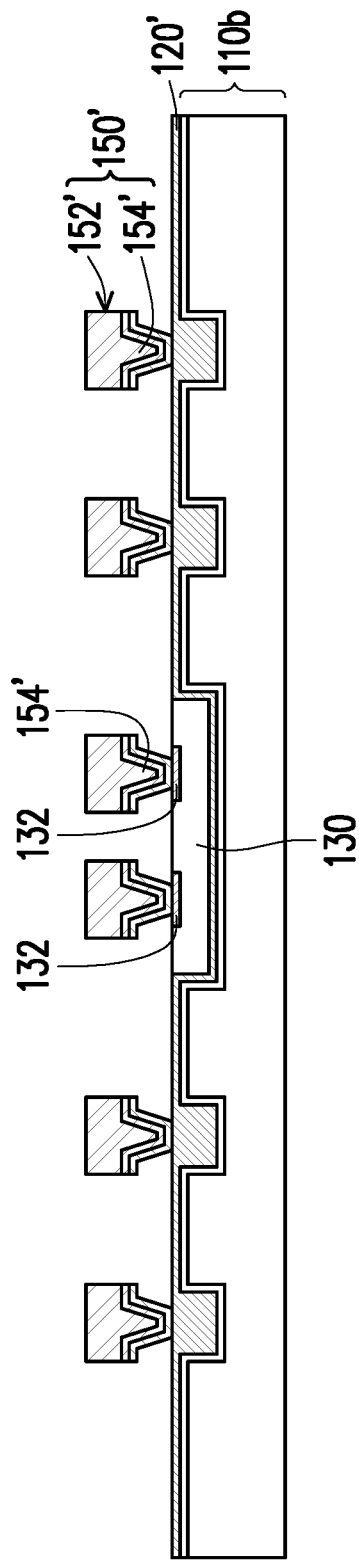

Next, referring to both FIG. 2F and FIG. 2G, the first patterned photoresist layer P1', the second patterned photoresist layer P2', part of the first metal layer 140, and part of the second metal layer 145 are removed, a circuit structure layer 150' is formed, and the metal layer 120' is exposed. The circuit structure layer 150' includes a patterned circuit 152' and multiple conductive vias 154', and the patterned circuit 152' is electrically connected to the electrode 132 of the chip 130 through the conductive via 154'. Meanwhile, the conductive via 154' is formed by the remaining first metal layer 140, the remaining second metal layer 145, and part of the conductive material layer 150a'. At this phase, the circuit structure layer 150' has been formed on the carrier board 110b.

Subsequently, referring to FIG. 2H, an encapsulant 160' is formed to cover the active surface 131 of the chip 130 and the circuit structure layer 150'. The active surface 131 of the chip 130 and a bottom surface 162' of the encapsulant 160' are coplanar.

Figure 2H:
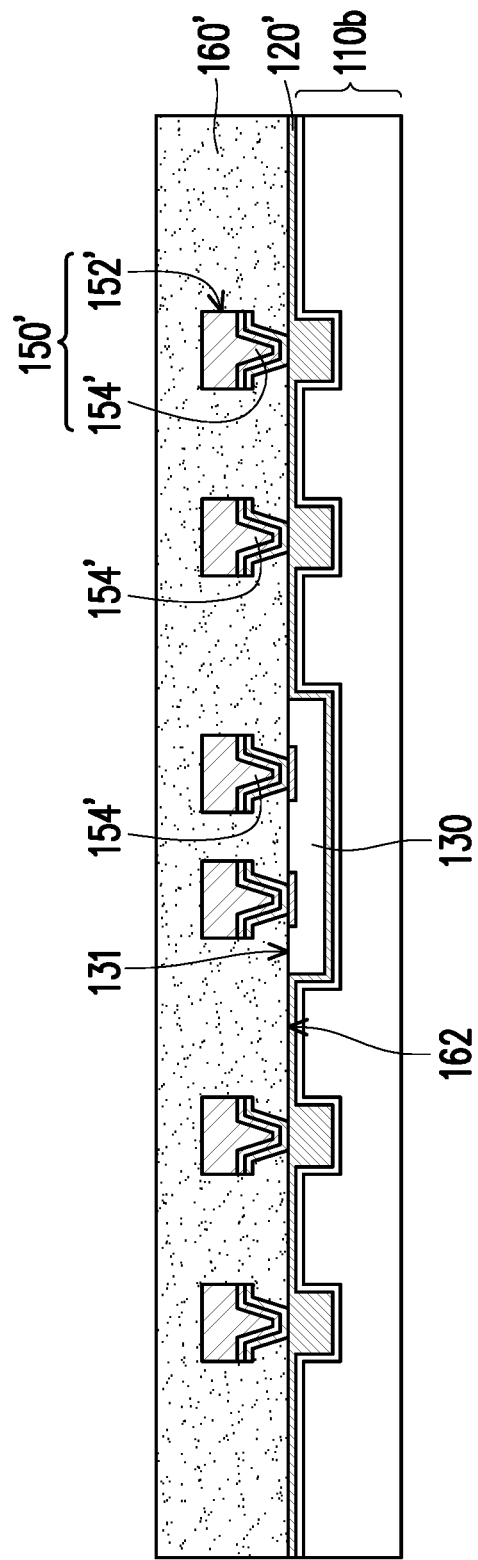

Finally, referring to both FIG. 2H and FIG. 2I, when the carrier board 110b is removed, both the conductive bumps T on the bottom surface 162' of the encapsulant 160' and part of the metal layer 120' on the back surface 133 of the chip 130 are exposed. Meanwhile, the encapsulant 160' covers the metal layer 120' and the active surface 131 of the chip 130 and encapsulates the patterned circuit 152' and the conductive vias 154'.

Meanwhile, the method for removing the carrier board 110b is that the encapsulant 160' is disposed on a vacuum platform (not shown) in a facing down manner, for example; and the encapsulant 160' is held firmly by a vacuum. Moreover, the encapsulant 160' is fixed by a mechanism and is separated from the metal layer 120' on the carrier board 110b along the interface of the stainless steel layer 114. Compared to the conventional method for removing the carrier board, the carrier board 110b in the embodiment requires no cutting, so the carrier board 110b can be reused, thereby effectively saving the manufacturing costs. Moreover, the method for removing the metal layer 120' is etching, for example. At this phase, the processing of a quad flat no-lead (QFN) type of chip package structure 100b1 has been completed.

In terms of structure, referring to FIG. 2I again, the chip package structure 100b1 includes the circuit structure layer 150', the chip 130, and the encapsulant 160'. The circuit structure layer 150' includes the patterned circuit 152' and the conductive vias 154'. The chip 130 has the active surface 131, the back surface 133 opposite to the active surface 131, and the electrodes 132 disposed on the active surface 131. The patterned circuit 152' is electrically connected to the electrodes 132 of the chip 130 through the conductive vias 154'. The encapsulant 160' covers the active surface 131 of the chip 130 and the circuit structure layer 150'. Specifically, the active surface 131 of the chip 130 and the bottom surface 162' of the encapsulant 160' are coplanar. In addition, the chip package structure 100b1 in the embodiment further includes the conductive bumps T, and the conductive bumps T are disposed on the bottom surface 162' of the encapsulant 160' and are electrically connected to the patterned circuit 152' through the conductive vias 154.

FIG. 2J is a schematic cross-sectional view illustrating a chip package structure according to an embodiment of the disclosure. In the embodiment, the reference numerals and a part of the contents of the above embodiments are used, the same reference numerals are used to denote the same or similar elements, and the description of the same technical contents is omitted. For the description of the omitted part, reference may be made to the above embodiments, and details are not iterated in the embodiment.

Referring to FIG. 2J, after the step of FIG. 2I, a surface treatment layer 170' may also be formed on a peripheral surface S of the conductive bumps T and on the metal layer 120' on the back surface 133 of the chip 130. Meanwhile, the material of the surface treatment layer 170' is tin, for example, but the disclosure is not limited thereto. At this phase, the processing of a quad flat no-lead (QFN) type of chip package structure 100b2 has been completed.

Since the chip package structure 100b2 in the embodiment has the surface treatment layer 170' disposed on the back surface 133 of the chip 130, on the side surface 135 of the chip 130 connected to the back surface 133 and the active surface 131, and on the peripheral surface S of the conductive bumps T, the surface treatment layer 170' can be directly served as a shielding layer for preventing electromagnetic interference. Compared to conventional shielding plates or grounding plates which are additionally disposed as requirements, the chip package structure 100b2 in the embodiment can have a thinner package thickness and contribute to the reduction of the manufacturing costs.

Based on the above, in the manufacturing method of the chip package structure in the disclosure, the stainless steel layer is formed on the substrate of the carrier board by sputtering. Therefore, in processing the circuit structure layer, good stability can be provided. Furthermore, the stainless steel layer formed by sputtering can have a smaller volume and weight compared to those of the conventional stainless steel plate, and it is safer and simpler in operation. In addition, the carrier board requires no cutting when being separated to expose the circuit structure layer, so the carrier board can be reused, thereby effectively saving the manufacturing costs. Moreover, in some embodiments of the chip package structure in the disclosure, a surface treatment layer may also be added to serve as a shielding layer for preventing electromagnetic interference, which contributes to a thinner package thickness and reduction of the manufacturing costs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a chip package structure, comprising:
  disposing a carrier board, wherein the carrier board comprises an accommodating cavity, a substrate, and a stainless steel layer sputtered on the substrate including inside of the accommodating cavity;
  disposing a chip in the accommodating cavity of the carrier board, wherein the chip comprises an active surface, a back surface opposite to the active surface, and a plurality of electrodes disposed on the active surface;
  forming a circuit structure layer on the carrier board, wherein the circuit structure layer comprises a patterned circuit and a plurality of conductive vias, and the patterned circuit is electrically connected to the plurality of the electrodes of the chip through the plurality of the conductive vias;
  forming an encapsulant to cover the active surface of the chip and the circuit structure layer, wherein the active surface of the chip and a bottom surface of the encapsulant are coplanar; and
  removing the carrier board to expose the chip disposed in the accommodating cavity.

2. The manufacturing method of the chip package structure according to claim 1, wherein a material of the substrate comprises a sheet-shaped glass fiber resin substrate, a roll-shaped glass fiber resin substrate, or a roll-shaped stainless steel substrate.

3. The manufacturing method of the chip package structure according to claim 1, further comprising:
  forming a metal layer on the stainless steel layer before disposing the chip in the accommodating cavity of the carrier board; and
  removing the metal layer when removing the carrier board.

4. The manufacturing method of the chip package structure according to claim 3, wherein the step of forming the circuit structure layer on the carrier board comprises:
  forming a first patterned photoresist layer on the metal layer, wherein the first patterned photoresist layer exposes the plurality of the electrodes of the chip and part of the metal layer;
  sputtering a first metal layer and a second metal layer on the first metal layer on the first patterned photoresist layer, on the exposed electrodes of the chip, and on the exposed metal layer;
  forming a second patterned photoresist layer on the second metal layer, wherein the second patterned photoresist layer is disposed above the first patterned photoresist layer and exposes part of the second metal layer;
  performing an electroplating process to form a conductive material layer on the second patterned photoresist layer and the exposed second metal layer; and
  removing the first patterned photoresist layer, the second patterned photoresist layer, part of the first metal layer, and part of the second metal layer to form the circuit structure layer and expose the metal layer, wherein the patterned circuit of the circuit structure layer comprises a plurality of inner pins and a plurality of outer pins, the plurality of the inner pins are separated from one another and disposed above the chip, and the plurality of the outer pins are connected to the plurality of the inner pins and extendedly beyond the encapsulant.

5. The manufacturing method of the chip package structure according to claim 4, wherein the encapsulant covers part of the metal layer and the active surface of the chip and encapsulates the plurality of the inner pins and the plurality of the conductive vias.

6. The manufacturing method of the chip package structure according to claim 5, further comprising:
  exposing on the metal layer on the back surface of the chip when removing the carrier board; and
  forming a surface treatment layer on the metal layer on the back surface of the chip and the surface of the outer pins.

7. The manufacturing method of the chip package structure according to claim 1, wherein the carrier board further comprises a plurality of indentations, wherein the plurality of the indentations surround the accommodating cavity, and the stainless steel layer and the substrate are conformally disposed.

8. The manufacturing method of the chip package structure according to claim 7, further comprising:

forming a metal layer on the stainless steel layer before disposing the chip in the accommodating cavity of the carrier board, wherein the metal layer fills the plurality of the indentations to define a plurality of conductive bumps; and exposing both the plurality of the conductive bumps on the bottom surface of the encapsulant and part of the metal layer on the back surface of the chip when removing the carrier board.

9. The manufacturing method of the chip package structure according to claim 8, wherein the step of forming the circuit structure layer on the carrier board comprises:

forming a first patterned photoresist layer on the metal layer, wherein the first patterned photoresist layer exposes the plurality of the electrodes of the chip and part of the metal layer;

sputtering a first metal layer and a second metal layer on the first metal layer on the first patterned photoresist layer, on the exposed electrodes of the chip, and on the metal layer;

forming a second patterned photoresist layer on the second metal layer, wherein the second patterned photoresist layer is disposed above the first patterned photoresist layer and exposes part of the second metal layer;

performing an electroplating process to form a conductive material layer on the second patterned photoresist layer and the exposed second metal layer; and removing the first patterned photoresist layer, the second patterned photoresist layer, part of the first metal layer, and part of the second metal layer to form the circuit structure layer and expose the metal layer.

10. The manufacturing method of the chip package structure according to claim 9, wherein the encapsulant covers the metal layer and the active surface of the chip and encapsulates the patterned circuit and the plurality of the conductive vias.

11. The manufacturing method of the chip package structure according to claim 10, further comprising:

forming a surface treatment layer on a peripheral surface of the plurality of the conductive bumps and the metal layer on the back surface of the chip after removing the carrier board.

12. A chip package structure, comprising:

a circuit structure layer comprising a patterned circuit and a plurality of conductive vias;

a chip comprising an active surface, a back surface opposite to the active surface, and a plurality of electrodes disposed on the active surface, wherein the patterned circuit is electrically connected to the plurality of the electrodes of the chip through the plurality of the conductive vias;

an encapsulant covering the active surface of the chip and the circuit structure layer, wherein the active surface of the chip and a bottom surface of the encapsulant are coplanar, wherein the patterned circuit comprises a plurality of inner pins and a plurality of outer pins, the plurality of the inner pins are separated from one another and disposed above the chip, the encapsulant encapsulates the plurality of the inner pins and the plurality of the conductive vias, and the plurality of the outer pins are connected to the plurality of the inner pins and extend beyond the encapsulant; and a surface treatment layer disposed on the back surface of the chip and a metal layer on a side surface of the chip connected to the back surface and the active surface.

13. A chip package structure, comprising:

a circuit structure layer comprising a patterned circuit and a plurality of conductive vias:

a chip comprising an active surface, a back surface opposite to the active surface, and a plurality of electrodes disposed on the active surface, wherein the patterned circuit is electrically connected to the plurality of the electrodes of the chip through the plurality of the conductive vias:

an encapsulant covering the active surface of the chip and the circuit structure layer, wherein the active surface of the chip and a bottom surface of the encapsulant are coplanar;

a plurality of conductive bumps disposed on the bottom surface of the encapsulant and electrically connected to the patterned circuit through the plurality of the conductive vias; and a surface treatment layer disposed on the back surface of the chip, a side surface of the chip connected to the back surface and the active surface, and a peripheral surface of the plurality of the conductive bumps.

* * * * *